United States Patent [19]

Sardella et al.

[11] Patent Number: 5,641,708
[45] Date of Patent: Jun. 24, 1997

[54] METHOD FOR FABRICATING CONDUCTIVE STRUCTURES IN INTEGRATED CIRCUITS

[75] Inventors: John C. Sardella, Highland Village; Alexander Kalnitsky, Dallas, both of Tex.

[73] Assignee: SGS-Thomson Microelectronics, Inc., Carrollton, Tex.

[21] Appl. No.: 387,243

[22] Filed: Feb. 13, 1995

Related U.S. Application Data

[62] Division of Ser. No. 255,552, Jun. 7, 1994, Pat. No. 5,418,398.

[51] Int. Cl.$^6$ .................................................. H01L 21/28
[52] U.S. Cl. ........................ 438/592; 438/636; 438/671; 438/657
[58] Field of Search .............................. 437/193, 186, 437/162, 187, 191; 257/754, 756

[56] References Cited

U.S. PATENT DOCUMENTS

| | | | |
|---|---|---|---|
| 4,409,722 | 10/1983 | Dockerty et al. | 437/193 |
| 4,450,021 | 5/1984 | Batra et al. | 437/193 |
| 4,494,301 | 1/1985 | Faraone | 257/756 |
| 4,697,333 | 10/1987 | Nakahara | 257/412 |
| 4,737,474 | 4/1988 | Price et al. | 257/763 |
| 4,873,204 | 10/1989 | Wong et al. | 257/770 |
| 4,954,855 | 9/1990 | Mimura | 257/412 |
| 5,147,820 | 9/1992 | Chittipeddi et al. | 437/200 |
| 5,168,072 | 12/1992 | Moslehi | 257/327 |
| 5,243,220 | 9/1993 | Shibata et al. | 257/760 |
| 5,302,538 | 4/1994 | Ishikawa et al. | 437/193 |
| 5,336,922 | 8/1994 | Sakamoto | 257/534 |
| 5,352,631 | 10/1994 | Sitaram et al. | 437/200 |

FOREIGN PATENT DOCUMENTS

| | | |
|---|---|---|
| 1-241125 | 8/1989 | Japan. |
| 6-061253 | 3/1994 | Japan. |
| 6-140355 | 5/1994 | Japan. |

OTHER PUBLICATIONS

S. Wolf, "Silicon Processing for the VLSI Era, vol. 2", Lattice Press, 1990, pp. 144–145.

S. Wolf, "Silicon Processing for the VLSI Era, vol. 1", Lattice Press, 1986, pp. 407–408.

*Primary Examiner*—John Niebling
*Assistant Examiner*—Thomas G. Bilodeau
*Attorney, Agent, or Firm*—Kenneth C. Hill; Theodore E. Galanthay; Lisa K. Jorgenson

[57] ABSTRACT

A method for fabricating conductive structures in integrated circuits. A conductive layer is formed over an underlying region in an integrated circuit. The conductive layer is then doped with impurities, and a thin amorphous silicon layer is formed over the conductive layer. A photoresist layer is then deposited and exposed to define a masking pattern. During exposure of the photoresist layer, the amorphous silicon layer acts as an anti-reflective layer. Portions of the photoresist layer are then removed to form a masking layer, and the insulating layer and amorphous silicon layer are then etched utilizing the masking layer to form conductive structures. During subsequent thermal processing, impurities from the conductive layer diffuse into the amorphous silicon layer causing the amorphous silicon layer to become conductive.

14 Claims, 2 Drawing Sheets

METHOD FOR FABRICATING CONDUCTIVE STRUCTURES IN INTEGRATED CIRCUITS

This is a division of application Ser. No. 08/255,552, filed Jun. 7, 1994, now U.S. Pat. No. 5,418,398.

BACKGROUND OF THE INVENTION

1. Field of the Invention

The present invention relates generally to the fabrication of integrated circuits, and more particularly to a method for fabricating conductive structures in an integrated circuit.

2. Description of the Prior Art

Proper signal line and gate patterning is important to the operation of an integrated circuit. Reflections off the surface of a signal line or gate during exposure of an overlying photoresist layer, however, can subsequently cause problems with the formation of the signal line or gate.

Reflection problems are intensified on integrated circuits having a varied topography. The sidewalls of the hills and valleys cause the radiation utilized to expose a photoresist layer to reflect back into the photoresist at various angles, resulting in poor image resolution. The term radiation includes such photolithography methods as visible or ultraviolet light, x-ray, and electron beam. Poor image resolution is especially undesirable in complex integrated circuits because of the need to maintain critical dimensions. Furthermore, those skilled in the art will recognize that notching, or a narrowing of the signal line, typically occurs as a result of reflections. Notching is especially a problem when the patterned signal line crosses a step. As known in the art, notching can lead to electromigration in metals, premature punch through and short channel effects in transistors, and other device failure mechanisms.

One technique which is used to solve reflection problems is a dyed photoresist. This technique, however, is not completely successful in integrated circuits having a varied topography. As known in the art, the photoresist layer is thicker in the valleys than at other locations on the integrated circuit. Therefore, it is necessary to overexpose the photoresist in order to allow the radiation to reach the photoresist located at the bottom of the valleys. This overexposure, however, can increase the reflections from the signal line or gate into the photoresist layer, thereby increasing the problems of poor image resolution and notching.

Other techniques which are used to solve reflection problems include the use of an anti-reflective coating on the surface of the signal line, or on the bottom or the top of the photoresist layer. One example of an anti-reflective coating is a thin layer of oxide. A problem arises however, when it is necessary to electrically probe the integrated circuit as part of an in line electrical test. As known in the art, oxide is an insulating material. Capping conductive material with an insulating material makes it difficult to electrically probe the integrated circuit, thereby making it difficult to test the integrated circuit during fabrication.

Therefore, it would be desirable to provide a method for fabricating conductive structures in integrated circuits which reduces the reflections into a photoresist layer while maintaining a conductive upper surface on the conductive structures. It is also desirable that such a method not significantly increase the complexity of the fabrication process.

SUMMARY OF THE INVENTION

A method is provided for fabricating conductive structures in integrated circuits. A conductive layer is formed over an underlying region in an integrated circuit. The conductive layer is then doped with impurities, and a thin amorphous silicon layer is formed over the conductive layer. A photoresist layer is then deposited and exposed to define a masking pattern. During exposure of the photoresist layer, the amorphous silicon layer acts as an anti-reflective layer. Portions of the photoresist layer are then removed to form a masking layer, and the amorphous silicon layer and conductive layer are then etched utilizing the masking layer to form conductive structures. During subsequent thermal processing, impurities from the conductive layer diffuse into the amorphous silicon layer causing the amorphous silicon layer to become conductive.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
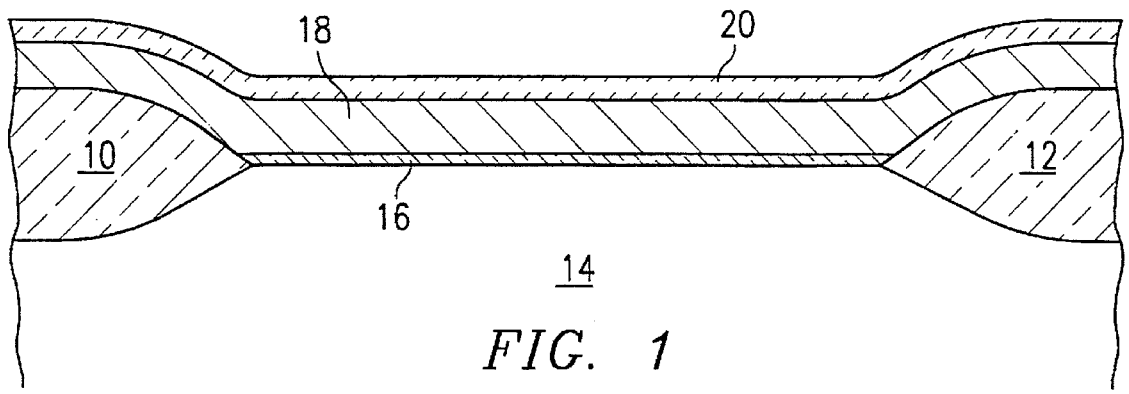
FIGS. 1–5 are cross sectional views of an integrated circuit illustrating a preferred method for fabricating conductive structures in integrated circuits.

FIGS. 1–4 are cross sectional views of an integrated circuit illustrating a preferred method for fabricating conductive structures in integrated circuits. Referring to FIG. 1, isolation regions 10, 12 are formed in an underlying region 14 in an integrated circuit. The underlying region 14 is typically a semiconductor substrate. A thin layer of insulating material 16, usually gate oxide, is then formed on a portion of the underlying region 14, and a conductive layer 18, preferably made of polycrystalline silicon, is deposited over the integrated circuit. Typically, the conductive layer 18 is then doped with impurities to improve its conductivity (not shown). An amorphous silicon layer 20 is then deposited over the conductive layer. The amorphous silicon layer 20 is preferably deposited to a thickness of approximately 100 to 200 angstroms.

Figure 2:
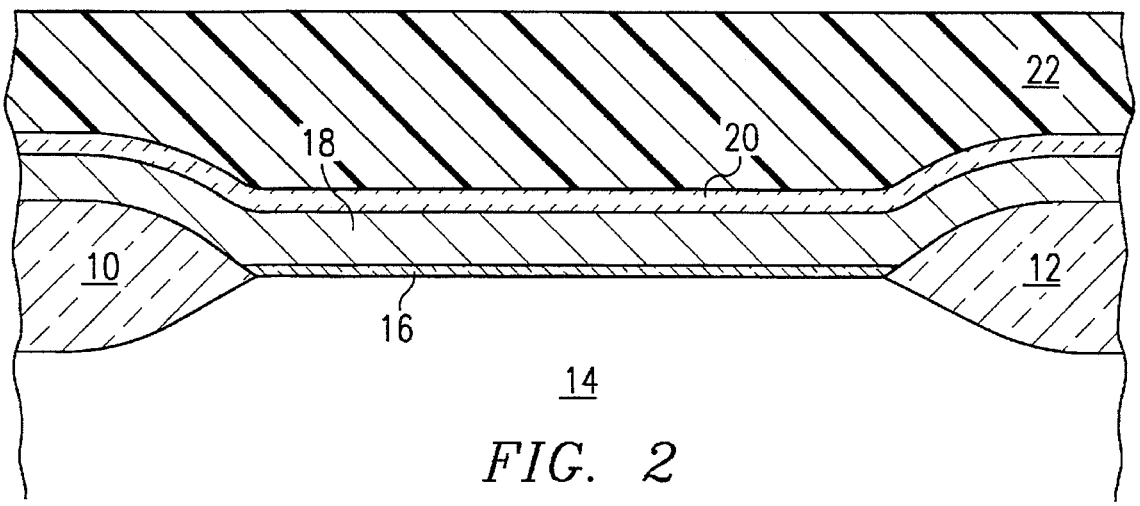

FIG. 2 illustrates the integrated circuit after a photoresist layer 22 is deposited over the amorphous silicon layer 20.

Figure 3:
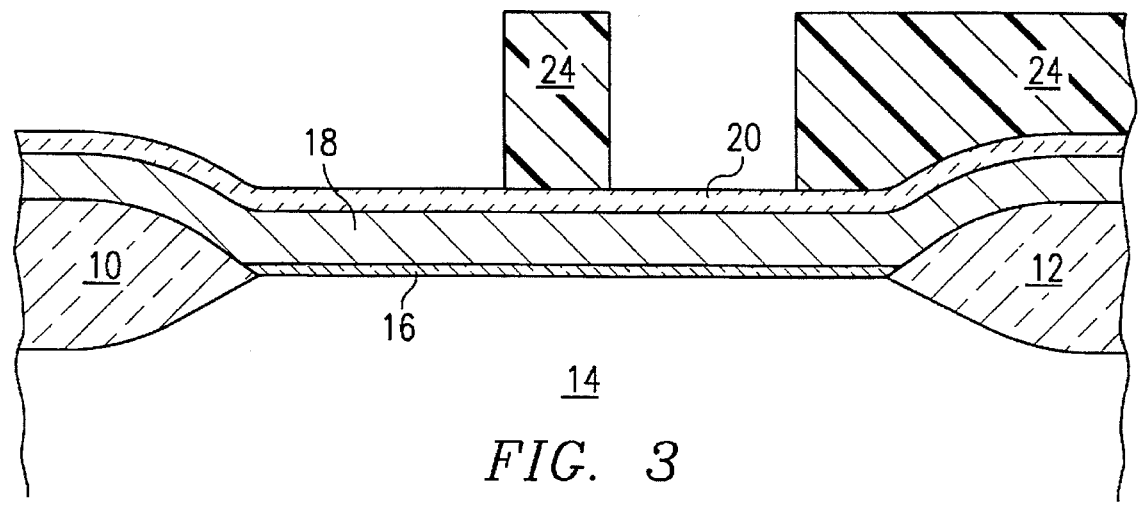

Referring to FIG. 3, the photoresist layer 22 is exposed to radiation in order to define a masking pattern. The term radiation includes such photolithography methods as visible or ultraviolet light, x-ray or electron beam. Portions of the photoresist layer 22 are then removed to form a masking layer 24. Those skilled in the art will recognize that if the photoresist layer 22 is a positive resist, those portions exposed to the radiation are removed, and if the photoresist layer 22 is a negative resist, the unexposed portions are removed.

During exposure of the photoresist layer 22, the amorphous silicon layer 20 acts as an anti-reflective layer and prohibits reflections back into the photoresist layer 22. This improves the image resolution and ultimately prevents notching.

Figure 4:
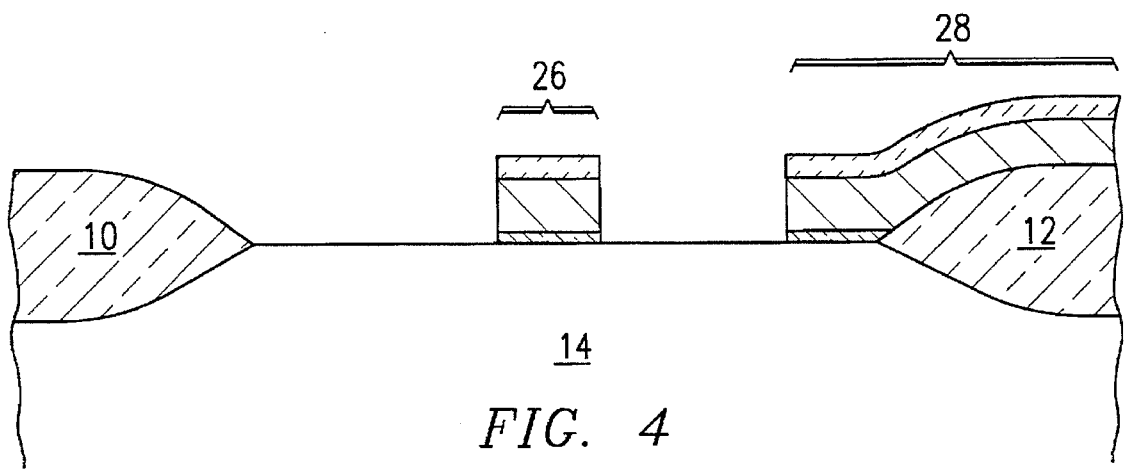

FIG. 4 illustrates the integrated circuit after the amorphous silicon layer 20 and the conductive layer 18 are etched utilizing the masking layer 24 to form conductive structures 26, 28. As can be seen, conductive structures 26, 28 comprise the remaining layer of insulating material 16, the remaining conductive layer 18, and the remaining amorphous silicon layer 20. And, because impurities from the conductive layer 18 diffuse into the amorphous silicon layer 20, the upper surface of the conductive structures 26, 28 is conductive, allowing for in line electrical testing and transistor characterization during fabrication of the integrated circuit.

If desired, a SALICIDE process can be performed at a later stage of the fabrication of the integrated circuit. The amorphous silicon layer 20 will be consumed during the SALICIDE process. Alternatively, if the conductive layer 18 is silicided before the amorphous silicon layer 20 is formed on the integrated circuit, it may be desirable to remove the amorphous silicon layer 20 before a contact is formed to conductive structures 26, 28. The amorphous silicon layer 20 may interfere with the performance of the contact because the amorphous silicon layer 20 has a high resistance compared to silicide.

There are several ways to remove the amorphous silicon layer 20. First, during formation of a contact opening to conductive structures 26, 28, the opening can be overetched to remove the amorphous silicon layer 20 which is exposed in the contact opening. Alternatively, after patterning conductive structures 26, 28, the integrated circuit can be annealed in an oxygen ambient which will convert the amorphous silicon layer 20 to a layer of oxide. Another alternative is to perform an isotropic etch after patterning conductive structures 26, 28 to remove the amorphous silicon layer 20.

Figure 5:
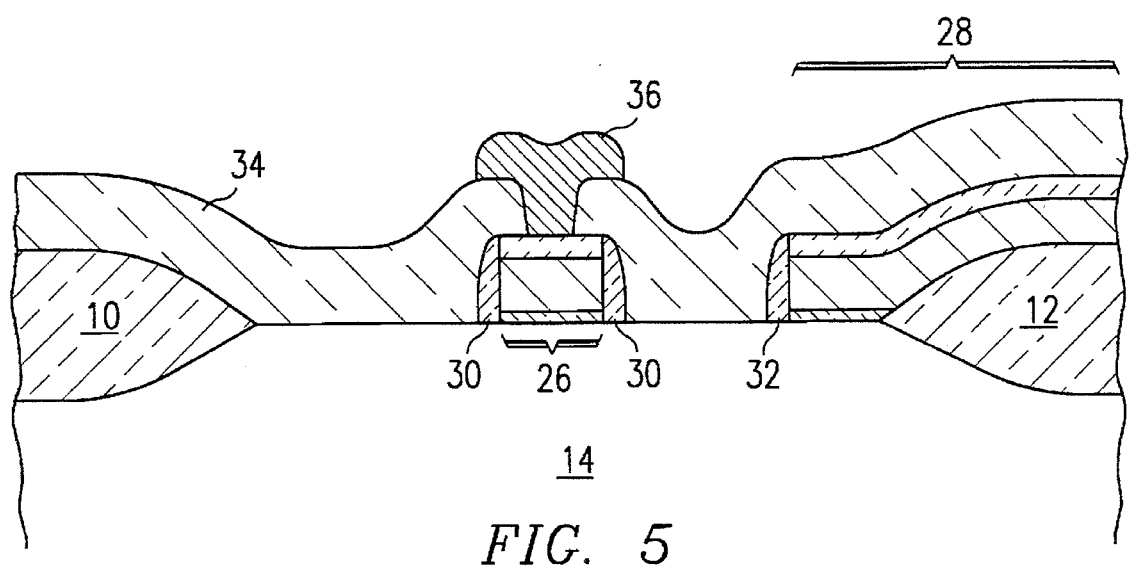

Referring to FIG. 5, sidewall spacers 30, 32 are formed alongside the conductive structures 26, 28 using techniques known in the art, and an insulating layer 34 is deposited over the integrated circuit. In the preferred embodiment, the insulating layer is made of oxide, but other insulating materials may be used. An opening is then formed through the insulating layer 34 to expose a portion of conductive structure 26. A conductive element 36 is formed over a portion of the insulating layer 34 and extends into the opening to make electrical contact with the amorphous silicon layer 20. If desired, a refractory metal barrier, such as titanium, can be formed in the contact and treated so that and the amorphous silicon layer 20 is consumed in a reaction (not shown). One example of a treatment which results in consuming the amorphous silicon layer 20 is a rapid thermal treatment. The integrated circuit is now ready for further processing steps.

Figure 6:
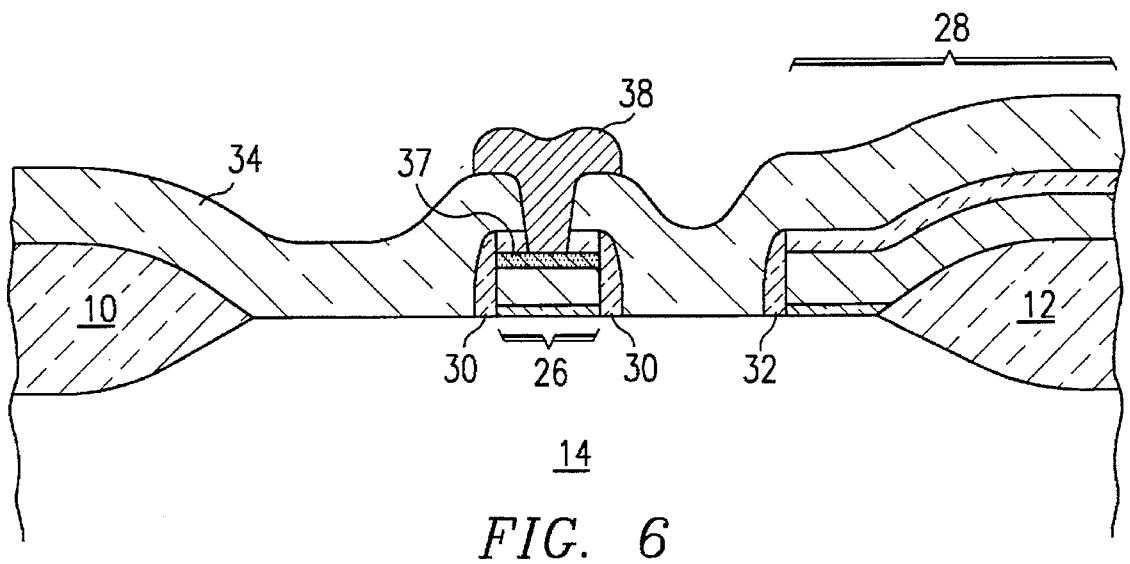
FIG. 6 is a cross sectional view of an integrated circuit illustrating an alternative preferred method for fabricating conductive structures in integrated circuits.

FIG. 6 is a cross sectional view of an integrated circuit illustrating an alternative preferred method for fabricating conductive structures in integrated circuits. The processing steps described with reference to FIGS. 1–4 are performed, with the additional step of siliciding the conductive layer 18 before the amorphous silicon layer 20 is formed on the integrated circuit. Sidewall spacers 30, 32 are then formed alongside the conductive structures 26, 28 using techniques known in the art, and an insulating layer 34 is deposited over the integrated circuit.

An opening is formed through the insulating layer 34 to expose a portion of the conductive structure 26. During formation of the opening, the portion of the amorphous silicon layer 20 exposed in the opening is also removed to expose a portion of the silicided conductive layer 36. It is desirable to remove the exposed amorphous silicon layer 28 because the amorphous silicon layer 20 has relatively high resistance and may interfere with the performance of the contact. A conductive element 38 is then formed over a portion of the insulating layer 34 and extends into the opening to make electrical contact with the silicided conductive layer 36. The integrated circuit is now ready for further processing steps.

The presently preferred embodiment described above provides a method for fabricating conductive structures in integrated circuits which reduces the reflections into a photoresist layer while maintaining a conductive upper surface on the conductive structures, and does not significantly increase the complexity of the fabrication process.

While the invention has been particularly shown and described with reference to a preferred embodiment, it will be understood by those skilled in the art that various changes in form and detail may be made therein without departing from the spirit and scope of the invention.

What is claimed is:

1. A method for fabricating a conductive structure in an integrated circuit, comprising the steps of:

forming a conductive layer over an underlying region in the integrated circuit;

doping the conductive layer with impurities;

forming a layer of amorphous silicon between 100 and 200 angstroms thick over the conductive layer;

depositing a photoresist layer over the amorphous silicon layer;

exposing the photoresist layer to define a masking pattern, wherein the amorphous silicon layer acts as an anti-reflective layer;

removing portions of the photoresist layer to form a masking layer;

patterning and etching the amorphous silicon layer and the conductive layer using the masking layer as a mask to form a conductive structure, wherein the remaining amorphous silicon layer forms a cap over the remaining conductive layer, and thermally processing the amorphous silicon and conductive layers so that impurities from the conductive layer diffuse into the remaining amorphous silicon layer such that the remaining amorphous silicon layer becomes conductive.

2. The method of claim 1, further comprising the step of forming a layer of insulating material over the underlying region before formation of the conductive layer.

3. The method of claim 1, wherein said step of forming the conductive layer comprises depositing a layer of polycrystalline silicon over the underlying region in the integrated circuit.

4. The method of claim 3, wherein said underlying region comprises a semiconductor substrate.

5. The method of claim 1, wherein said step of removing portions of the photoresist layer comprises removing exposed portions of the photoresist layer.

6. The method of claim 1, wherein said step of removing portions of the photoresist layer comprises removing unexposed portions of the photoresist layer.

7. The method of claim 1, further comprising the steps of:

forming an insulating layer over the integrated circuit;

forming an opening through the insulating layer to expose a portion of the conductive structure; and forming a conductive element over a portion of the insulating layer and extending into the opening, wherein the conductive element makes electrical contact with the conductive structure.

8. A method for fabricating a conductive structure in an integrated circuit, comprising the steps of:

forming a conductive layer over an underlying region in the integrated circuit;

doping the conductive layer with impurities;

forming a layer of amorphous silicon over the conductive layer;

forming a masking layer over the amorphous silicon layer;

patterning and etching the amorphous silicon layer and the conductive layer using the masking layer as a mask to form a conductive structure, wherein the remaining amorphous silicon layer forms a cap over the remaining conductive layer;

forming an insulating layer over the integrated circuit;

forming an opening through the insulating layer to expose a portion of the conductive structure;

forming a conductive element over a portion of the insulating layer and extending into the opening, wherein the conductive element makes electrical contact with the conductive structure; and removing the portion of the amorphous silicon layer exposed in the opening before forming the conductive element.

9. The method of claim 8, further comprising the step of forming a layer of insulating material over the underlying region before formation of the conductive layer.

10. The method of claim 8, wherein said step of forming the conductive layer comprises depositing a layer of polycrystalline silicon over the underlying region in the integrated circuit.

11. The method of claim 8, wherein said underlying region comprises a semiconductor substrate.

12. The method of claim 8, wherein said step of forming a masking layer comprises the steps of:

depositing a photoresist layer over the amorphous silicon layer;

exposing the photoresist layer to define a masking pattern, wherein the amorphous silicon layer acts as an anti-reflective layer; and removing portions of the photoresist layer to form a mask during patterning of the amorphous silicon and conductive layers.

13. The method of claim 12, wherein said step of removing portions of the photoresist layer comprises removing exposed portions of the photoresist layer.

14. The method of claim 12, wherein said step of removing portions of the photoresist layer comprises removing unexposed portions of the photoresist layer.

* * * * *